US005646543A

United States Patent [19]
Rainal

[11] Patent Number: 5,646,543
[45] Date of Patent: Jul. 8, 1997

[54] INTEGRATED CIRCUIT HAVING REDUCED INDUCTIVE NOISE

[75] Inventor: Attilio Joseph Rainal, Morristown, N.J.

[73] Assignee: Lucent Technologies Inc., Murray Hill, N.J.

[21] Appl. No.: 542,242

[22] Filed: Oct. 12, 1995

[51] Int. Cl.$^6$ .................................................. H03K 17/16
[52] U.S. Cl. .................................................. 326/26; 326/28
[58] Field of Search .......................... 326/26–28, 93–96

[56] References Cited

U.S. PATENT DOCUMENTS

| | | | |
|---|---|---|---|
| 4,479,216 | 10/1984 | Krambeck et al. | 371/61 |
| 4,587,445 | 5/1986 | Kanuma | 326/28 |
| 4,857,765 | 8/1989 | Cahill | 326/26 |
| 5,073,730 | 12/1991 | Hoffman | 326/93 |
| 5,229,657 | 7/1993 | Rackley | 326/96 |
| 5,488,325 | 1/1996 | Sato | 326/93 |

OTHER PUBLICATIONS

A.J. Rainal "Computing Inductive Noise of Chip Packages", *AT&T Bell Laboratories Tech. J.*, vol. 63, No. 1, (1984).
A.J. Rainal, "Eliminating Inductive Noise of External Chip Interconnections", *IEEE Journal of Solid–State Circuits*, vol. 29, No. 2, pp. 126–129 (1994).

*Primary Examiner*—David R. Hudspeth
*Assistant Examiner*—Benjamin D. Driscoll
*Attorney, Agent, or Firm*—Robert E. Rudnick

[57] ABSTRACT

An integrated circuit output section has a controller that controls a plurality of drivers to transmit data signals over output lines in a group staggered manner to substantially reduce the generation of inductive noise or ground and power bounce. The controller staggers the transmission of the data signals in each group relative to the other groups to achieve a reduction in inductive noise of greater than 25% using relatively short total staggering times of less than five times the transition switching time of a driver for the groups of data signals. Also, an enhanced reduction in inductive noise is achieved with a total staggering time equal to or less than a driver transition switching time, wherein at least one group has a different number of data signals than the other groups.

18 Claims, 3 Drawing Sheets

INTEGRATED CIRCUIT HAVING REDUCED INDUCTIVE NOISE

FIELD OF THE INVENTION

The invention relates to integrated circuit communications in general and more particularly to a technique for the transmission of data signals with reduced inductive noise.

BACKGROUND OF THE INVENTION

Presently, inductive noise caused by many switching simultaneously is a major design and performance limitation of high-speed, high pin-out integrated circuit chips. Inductive noise, also referred to as ground bounce, is attributed to when a large number of chip output drivers switch simultaneously. The simultaneous switching causes a substantial transient current to appear in the chip's ground and power distribution systems. This transient current causes a corresponding transient voltage difference to develop between the ground in the chip and the ground in an associated printed wiring board (PWB). This voltage difference can cause false switching of integrated circuit devices and corresponding system errors or loss of data. A more detailed discussion of inductive noise is provided in A. J. Rainal, "Computing Inductive Noise of Chip Packages", *AT & T Bell Laboratories Tech. J.*, Vol. 63, No. 1, (1984), which is incorporated by reference herein.

Although a pin-out array size of 256 ×256 can be fabricated on a single chip, such a large array is presently impractical because of the inductive noise that would be generated by the large number of output drivers that provide data signals on corresponding output leads. Various techniques for reducing inductive noise are known. One such technique uses a pair of leads and corresponding balanced circuit drivers for transmitting each data signal. An exemplary balanced driver system is described in A. J. Rainal, "Eliminating Inductive Noise of External Chip Interconnections", *IEEE Journal of Solid-State Circuits*, Vol. 29, No. 2, pp. 126–129 (1994), which is incorporated by reference herein. In such a system, a data signal is transmitted by causing the current traversing a first output lead of the pair to have the same amplitude but opposite polarity of the current traversing the other output lead to negate inductive noise. However, balanced driver techniques tend to be difficult to implement in CMOS integrated circuits because of the inherent difficulty in causing two CMOS drivers to switch simultaneously in controlling the current traversing the balanced output lead pair. This is especially the case for data signal rise times on the order of less than three nanoseconds.

Thus, a need exists for a integrated circuit driver technique that reduces inductive noise and can be implemented in a variety of different types of semiconductor devices including CMOS devices.

SUMMARY OF THE INVENTION

An integrated circuit includes a controller coupled to a plurality of output drivers to stagger the transmission of output data signals by staggering groups of output data signals. The controller provides control signals in a manner to cause the staggered transmission of the groups of data signals which reduces the number of drivers that simultaneously transmit data signals. It is possible to use relatively short total staggering times of less than five times the transition switching time of an output driver. The transition switching time of a driver is the approximate time duration of a current spike that occurs at the output of a driver during the transmission of a data signal switching from one logic state to another logic state. At such short total staggering transition times, a constructive combination of the inductive noise occurs due to the transmission of the groups of data signals. However, despite this constructive combination the invention surprisingly produces a reduction in inductive of greater than 25% over a corresponding non-staggered transmission of data signals.

The use of a non-uniform number of data signals in the groups with at least one group including a different number of data signals than the other groups achieves a surprising enhanced reduction in inductive noise for total staggering times equal to or less than the driver transition switching time. For instance, when using a total staggering time of approximately equal to the driver transition switching time it is possible to achieve a reduction in inductive noise of greater than 70% in a 32 bit integrated circuit output section using four groups containing seven, four, nine and twelve drivers to generate the corresponding data signals versus 58% using four groups of eight data signals. It is further possible to use an identical number of data signals in each group with relatively short total staggering times of less than five times the driver transition switching time in accordance with the invention.

According to one embodiment of the invention, the controller includes a number of delay circuits that is one less than the number of driver groups. Each delay circuit provides a control signal for a corresponding group of drivers except for a first group of drivers. A separate, control signal is provided to the first group to enable transmission of the data signals by the drivers in that group. Upon receipt of the control signal, the drivers in the first group transmit their data signals. The control signal of the first group is also provided to one of the delay circuits which generates the control signal for the second group after a particular delay. As a result, transmission of the data signals by the second group of drivers is delayed relative to the transmission of the first driver group. If more than two groups are used, another delay circuit receives the control signal for the second group and generates a corresponding control signal for a third output driver group after the particular delay. In this manner, the controller provides control signals in a staggered manner to the respective output driver groups.

This relatively short staggering of the control signals and grouping of the output drivers can easily be implemented in a large variety of types of semiconductor integrated circuits including CMOS integrated circuits. The invention does not require any complex interconnect requirements such as balanced drivers or precise line loads. As a consequence, it can advantageously be manufactured and electrically coupled to a printed wiring board (PWB) or a multi-chip module (MCM) in large quantities using conventional commercial production techniques. The reduction in inductive noise achieved by the invention also facilitates the use of less costly interconnects, such as wire bonds, for the electrical coupling of the integrated circuit to a PWB or a MCM in those instances that typically require more costly electrical coupling, such as ball grid arrays, flip-chips or direct chip attachment, to maintain acceptable levels of inductive noise.

Moreover, since the groups of output drivers of the invention transmit data signals in a staggered manner, the invention enables the data to advantageously be provided to the output driver groups in a likewise staggered manner giving the integrated circuit more time to provide data to those output driver groups having the substantially largest transmission delay. The invention also reduces the number of parallel interconnections between the integrated circuit and PWB or MCM or package than are required in conventional arrangements to minimize inductive noise.

Additional features and advantages of the present invention will become more readily apparent from the following detailed description and accompanying drawings.

DETAILED DESCRIPTION

The invention is based on the discovery that a surprising and substantial reduction in integrated circuit's inductive noise is achieved by staggering the transmission of data signals by staggering groups of output data signals using relatively short total staggering times of less than five times the transition switching time $T_b$ of an output drive. The transition switching time $T_b$ of a driver is the approximate time duration of a current spike that occurs at the output of a driver during the transmission of a data signal switching from one logic state to another logic state. Despite the constructive combination that causes the inductive noise by such short total staggering times the invention surprisingly produces a reduction in inductive noise of greater than 25% over a corresponding non-staggered transmission of data signals.

A surprising enhanced reduction in inductive noise is achieved when at least one of the groups contains a different number of output data signals than the other group or groups when a total staggering time is used that is equal to or less than a driver transition switching time $T_b$. It is further possible to use an identical number of data signals in each group with a total staggering time of less than five times the driver transition switching time $T_b$ according to the invention, albeit with less reduction in inductive noise for a total staggering time equal to or less than the driver transition switching time $T_b$ than with the non-uniform data signal grouping.

In accordance with the invention, a controller is coupled to output drivers in an output section of an integrated circuit to stagger the transmission of the groups of output signals. Accordingly, it is possible to use numerous controller and output driver configurations in practicing the invention. An exemplary configuration is described in detail below and depicted in FIGS. 1 and 2 for illustration purposes only and is not meant to be a limitation of the invention.

Figure 1:
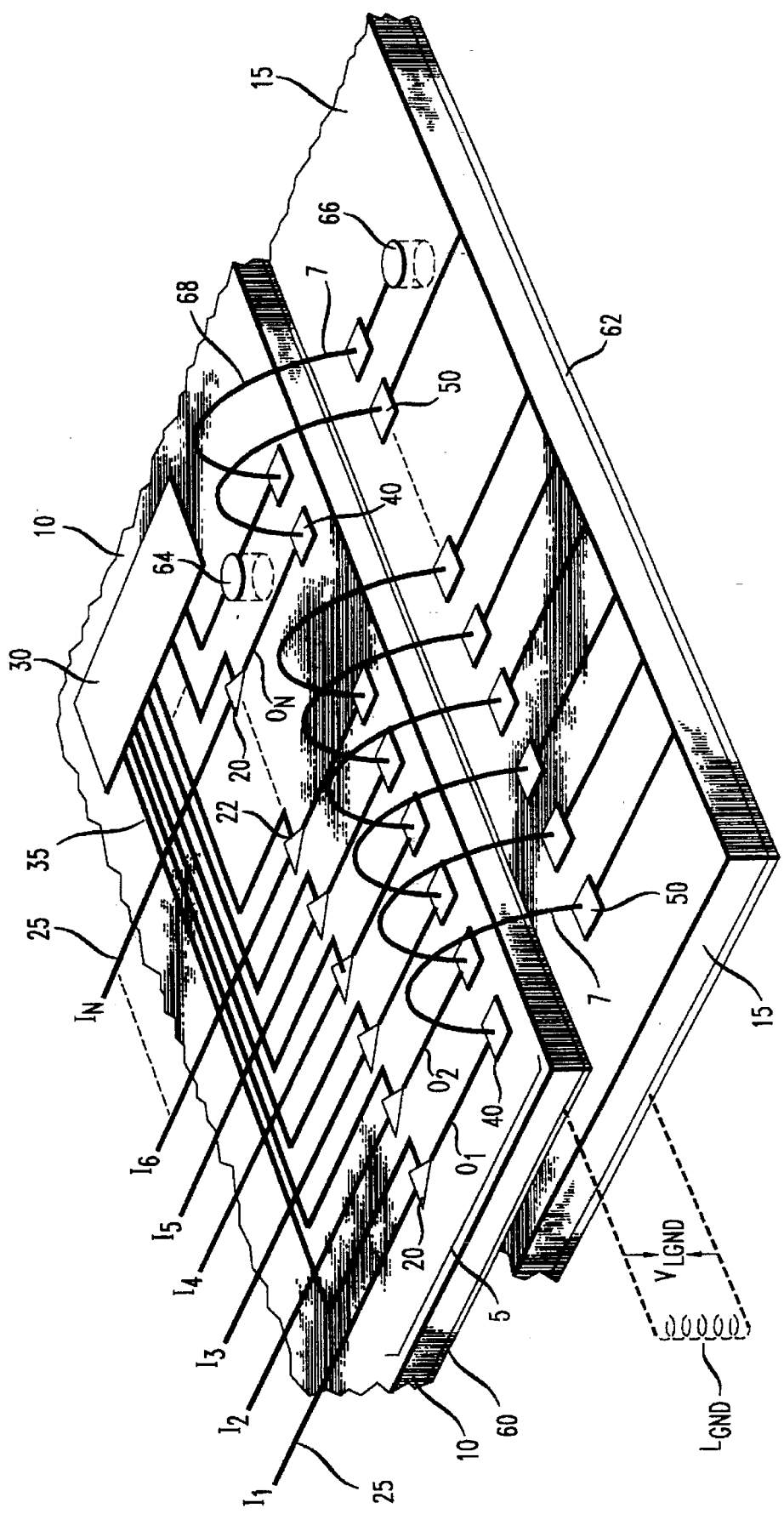
FIG. 1 illustrates a schematic block diagram of an output section of an exemplary integrated circuit chip in accordance with the present invention.

FIG. 1 illustrates an exemplary output section 5 of an integrated circuit 10 in accordance with the present invention. The output section 5 is electrically coupled to an interconnect 15, such as a printed wiring board (PWB) or multi-chip module (MCM), by wire bonds 7. The interconnect 15 provides electrical communication between the integrated circuit 10 and other integrated circuits or electrical components, not shown, that are coupled to the interconnect 15. The integrated circuit output section 5 includes a plurality of controllable output drivers 20 and a controller 30, such as a timing controller. The plurality of drivers 20 in the output section 5 are capable of transmitting a like plurality of data signals, such as data bits of one or more data words that are typically transmitted in a parallel manner by a conventional integrated circuit. As a consequence, it is possible to incorporate the output section 5 in, for example, microprocessors, co-processors, microcontrollers, interface adapter, application specific integrated circuits, and output buffers coupled to high speed memories.

It is possible for each driver 20 to receive a respective one of data signals $I_1$ to $I_N$ over a respective signal interconnect 25 that was generated by circuits, not shown, in the integrated circuit 10. It is further possible for data to be transmitted in each of the signals $I_1$ to $I_N$ using signal levels, such as voltage levels, corresponding to particular logic states of the data. In such signals, a transition from one logic state to another occurs by a corresponding transition in the signal levels of the data signals.

Figure 2:
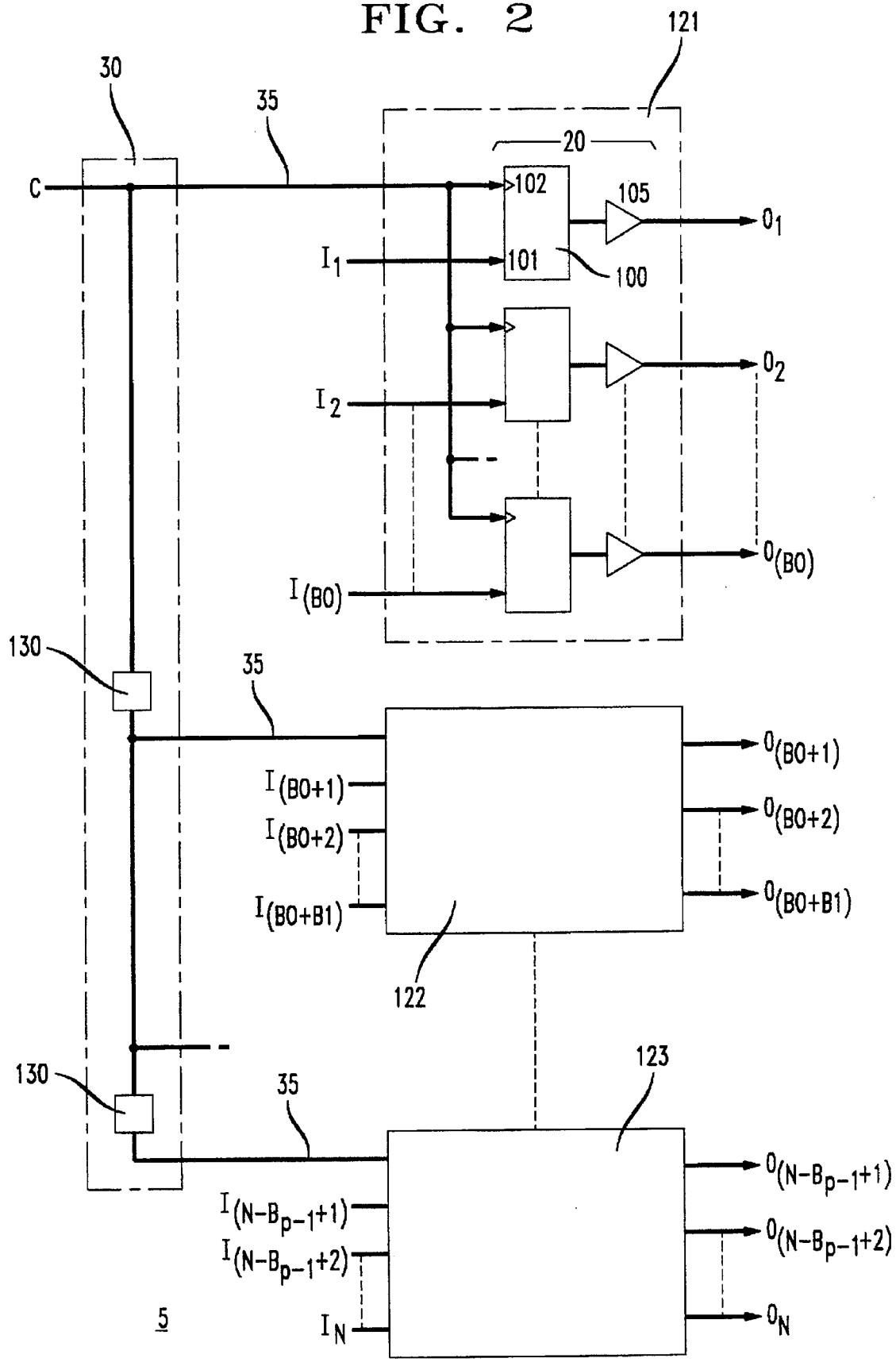
FIG. 2 illustrates a more detailed schematic block diagram of the output section of FIG. 1 including an exemplary timing controller configuration.

As shown in FIG. 2, a driver 20 can have a control input 22 connected to the controller 30 by one of a plurality of control interconnects 35. An output of the driver 20 is electrically interconnected to a corresponding one of bond pads 40. The bond pads 40 are also coupled to bond pads 50 located on the interconnect 15 by the wire bonds 7. The bond pads 50, in turn, are electrically interconnected to the other integrated circuits or electrical components, not shown. Intermediary components can also be used.

A ground plane 60 of the integrated circuit 10 is electrically coupled to a ground plane 62 of the interconnect 15 by a plurality of electrical connections including ground vias 64 and 66 and wire bond 68. An inductive noise voltage $V_{Lgnd}$ occurs across an effective ground inductance $L_{gnd}$ created by the plurality of electrical connections between the ground planes 60 and 62. The effective ground plane inductance $L_{gnd}$ is the cumulative inductance of the electrical connections between the ground planes 60 and 62 and is symbolically represented by a phantom inductor in FIG. 1 for discussion purposes. No actual external inductor should be used to connect the ground planes 60 and 62. In a similar manner, an inductive noise voltage also occurs across an effective inductance between the power planes (not shown) of the integrated circuit 10 and the interconnect 15.

In operation, the controller 30 transmits a control signal over a respective control interconnect 35 to an output driver 20. In response, the output driver 20 transmits a respective one of output data signals $O_1$ to $O_N$ corresponding to the respective one of the input data signals $I_1$ to $I_N$ that it receives at its input. The symbol N corresponds to the total number of drivers 20. Accordingly, the input and output data signals $I_1$ and $O_N$ represents the number of the last driver 70 of the output section 5. Each one of the output data signals $O_1$ to $O_N$ is transmitted by the drivers 20 to a corresponding bond pad 40.

It is possible for the drivers 20 to be of a type that continuously transmit a data signal corresponding to a particular logic state, such as a signal having a particular signal level, until a control signal is received from the timing controller 30. At that time, such a driver 20 would then continuously transmit an output data signal based on the input data signal that is received at the time of receipt of the control signal. Accordingly, if a respective one of the data signals $I_1$ to $I_N$ does not undergo a signal transition between receipt of two control signals then the output data signal would likewise not undergo a signal transition. However, if a transition occurs in the input data signal then a change will occur in the respective transmitted output signal but not until the control signal is received from the controller 30.

It is further possible for the output drivers 20 to transmit each of the data signals $O_1$ to $O_N$ using signal levels. In this manner, the transmission of a data signal corresponding to transition for one logic state to another is a switching of the output data signal from one signal level to another. This is referred to as a switching of the driver 20.

The number of drivers 20 that switch at one instance during the transmission of the data signals is dependent upon the actual information being transmitted. For instance, in conventional integrated circuits, if eight drivers are used to transmit eight bit words then the transmission of the word |0000 0000| and the subsequent transmission of the word |0101 0101| will cause four output drivers to switch. The larger the number of the drivers that switch simultaneously the greater the transient difference in ground potentials and the greater the corresponding inductive noise $V_{Lgnd}$ that is produced across the effective inductance $L_{gnd}$ as well as between the power planes. Such inductive noise can produce data errors within the integrated circuit as well as in integrated circuits and other electronic components coupled to a corresponding interconnect. The electrical coupling of the ground planes reduces inductive noise to some degree. However, errors due to inductive noise are pervasive in conventional CMOS integrated circuits where the number of output drivers exceed approximately 32.

Controlling the output drivers 20 to transmit data signals in two or more groups with at least one group having a different number of data signals than the other group or groups achieves a substantial reduction in inductive noise. Further, controlling the output drivers 20 to transmit data signals in two or more groups having identical number of data signals provides an enhanced reduction in inductive that is generally not as substantial as the reduction achieved with the non-uniform grouping of data signals. The number of groups containing identical numbers of data signals that achieves the substantially largest inductive noise reduction can be determined based on the permitted total staggering time.

A more detailed schematic representation of the integrated circuit output section 5 having the drivers 20 arranged into groups is shown in FIG. 2. Similar components in FIGS. 1 and 2 are like numbered for clarity, for example, the data signals $I_1$ to $I_N$ and the timing controller 30. In FIG. 2, the plurality of drivers 20 are shown organized into groups 120. A first and second group are shown by dashed outlines 121 and 122, respectively. A last driver group is also shown by a dashed outline 123. Although the number of groups shown in FIG. 2 is greater than three, it should be readily understood that two or more groups can be used in accordance with the invention.

The labels for the input and output signals $I_1$ to $I_N$ and $O_1$ to $O_N$ denote the number of groups 120 using the symbol P and the number of drivers 20 in the respective groups 120 using the symbol Bx where x is an integer from 0 to P−1. Accordingly, if the first group 121 contained five drivers 20 then the value B0 would equal 5 and a first driver of the second group 122 receiving the input data signal $I_{(B0+1)}$ and transmitting the output data signal $O_{(B0+1)}$ would receive and transmit the signals $I_6$ and $O_6$, respectively. The particular numbers of drivers employed in each of the groups and the specific number of groups that achieve superior reduction in inductive noise in accordance with the invention is described in detail below.

As shown in FIG. 2, an exemplary driver 20 includes a buffer 100, such as a D-type flip-flop, and a line driver 105. The buffer 100 receives a corresponding one of the data signals $I_1$ to $I_N$ at a data input 101 and the control signal transmitted by the controller 30 over an interconnect 35 at a control input 102. Each driver 105 transmits a respective one of the output data signals $O_1$ to $O_N$. Although the controllable drivers 20 are shown including flip-flops as the buffers 100 and line drivers 105, it is possible to use any data signal driver system for the controllable drivers 20 whose switching is controlled by an input signal and a control signal.

At least one control interconnect 35 provides a particular control signal from the controller 30 to the buffer 100 of each driver 20 in a particular group. It is possible for the controller 30 to include, for example, a plurality of delay circuits 130 as is shown within the dashed outline of the timing controller 30 in FIG. 2. It is possible for a delay circuit 130 to provide the control signal to one of the groups 120 after a particular delay $t_0$ interval relative to the generation of the control signal for a previous one of the groups 120. An exemplary delay circuit 130 is shown in detail in FIG. 7 of U.S. Pat. No. 4,479,216, assigned to the assignee of the present invention, which is incorporated by reference herein. Other suitable controller configurations include, for example, multiplexer and binary counter arrangements.

The timing controller 30 receives a clock signal C. It is further possible for the control signal to correspond to the points in time when other integrated circuits and electrical components associated with the interconnect 15 of FIG. 1 are ready to receive data signals. It is possible for the clock signal C to alternatively originate in circuits within or associated with the integrated circuit 10 to indicate that the data signals $I_1$ to $I_N$ are ready for transmission as the output data signals $O_1$ to $O_N$.

The clock signal C is provided from the controller 30 to the first group of drivers 121 as the control signal. The clock signal C is also provided to a respective delay circuit 130 in the timing controller 30. After a particular delay time $t_0$, that delay circuit 130 provides a control signal to the second group of drivers 122. As a consequence, drivers 20 in the second group 122 transmit their data signals after the particular delay $t_0$ relative to the data signal transmission of the drivers 20 in the first group 121. The control signal provided to the second driver group 122 is also provided to another delay circuit 130 for generating another activation signal for a third driver group. Accordingly, drivers in the third group would transmit their data signals after a particular delay $t_0$ from the data signal transmission of the drivers in the second group 122 and after a particular delay 2 $t_0$ from the transmission of the drivers in the first group 121.

In this manner, the controller 30 staggers the transmission of the output data signals $O_1$ to $O_N$ by the drivers in each of the groups 120. Although the delay circuits 130 shown in FIG. 2 provide identical delay intervals it should be understood that delay circuits providing different delay intervals can be used in accordance with the invention. Also, the use of the external control signal C in the output section 5 is for illustration only. It is alternatively possible for the controller 30 to generate its own initial control signal for the first output driver group 121 in accordance with the present invention.

The total staggering time $T_{Tot.}$ can be represented by a normalized total staggering value $\tau$ based on the transition driver switching time $T_b$ such that $\tau=[T_{Tot.}+T_b]/T_b$. For instance, an output section having a normalized staggering value $\tau=2$ uses a total staggering time $T_{Tot.}$ that is equal to the driver transition switching time $T_b$. Thus, a value $\tau=6$ corresponds to a total staggering time $T_{Tot.}$ that is equal to five times the driver transition switching time.

In an output section 5 employing a total staggering value $\tau=2$, the drivers 20 in the last group 123 are activated a time interval later than the first output driver group 121 that is approximately equal to the driver transition switching time. If four groups are used in the output section then the delay in the transmission of the control signals to the second, third and fourth group relative to the control signal provided to the first group occurs at 0.33, 0.67 and 1.0 times the driver transition switching time, respectively. Accordingly, each of the delay circuits 130 in FIG. 2 would provide a delay in the generation of its control signal of approximately 0.33 times the driver transition switching time.

A ratio U corresponds to a substantially maximum percentage of inductive noise for a particular grouping configuration relative to the conventional output section having the same total number of output drivers without group staggering. For instance, a ratio of 0.289, shown in the below Table B, indicates that no more than 28.9% of a substantially largest inductive noise generated by a conventional output section is present in the particular corresponding driver grouping configuration. Accordingly, such a grouping configuration of output drivers would achieve a reduction in inductive noise of 71.1% (100% −28.9%) or greater.

In an embodiment of the invention with at least one group contains a different number of drivers than the other group or groups is able to achieve an enhanced reduction in inductive noise when short total staggering times equal to or less than the driver transition switching time $T_b$ are used. The number of drivers 20 included in each group to obtain a superior performance in reducing inductive noise can be determined based on: (1) the total number of output drivers, (2) the number of driver groups used, and (3) an acceptable total staggering transmission time. The acceptable total staggering time for the transmission of the data signals is partially dependent on the requirements of those other integrated circuits or electrical components associated with the interconnect 15 that receive the data signals $O_1$ to $O_N$.

An exemplary method for determining the approximate number of drivers in each group to achieve the superior results is to calculate the inductive noise voltage $V_{lgnd}$, shown in FIG. 1, for particular groupings of data signals over a specific total staggering time. As used herein, the inductive noise voltage $V_{Lgnd}$ as a function of time is referred to as $V_{Lgnd}(t)$. Suitable techniques for calculating the inductive noise voltage $V_{Lgnd}(t)$ for each of the particular groups include, for example, using traditional circuit theory on a circuit model of the circuit illustrated in FIG. 1. Such traditional circuit theory includes, for example, nodal and loop analysis.

Figure 3:
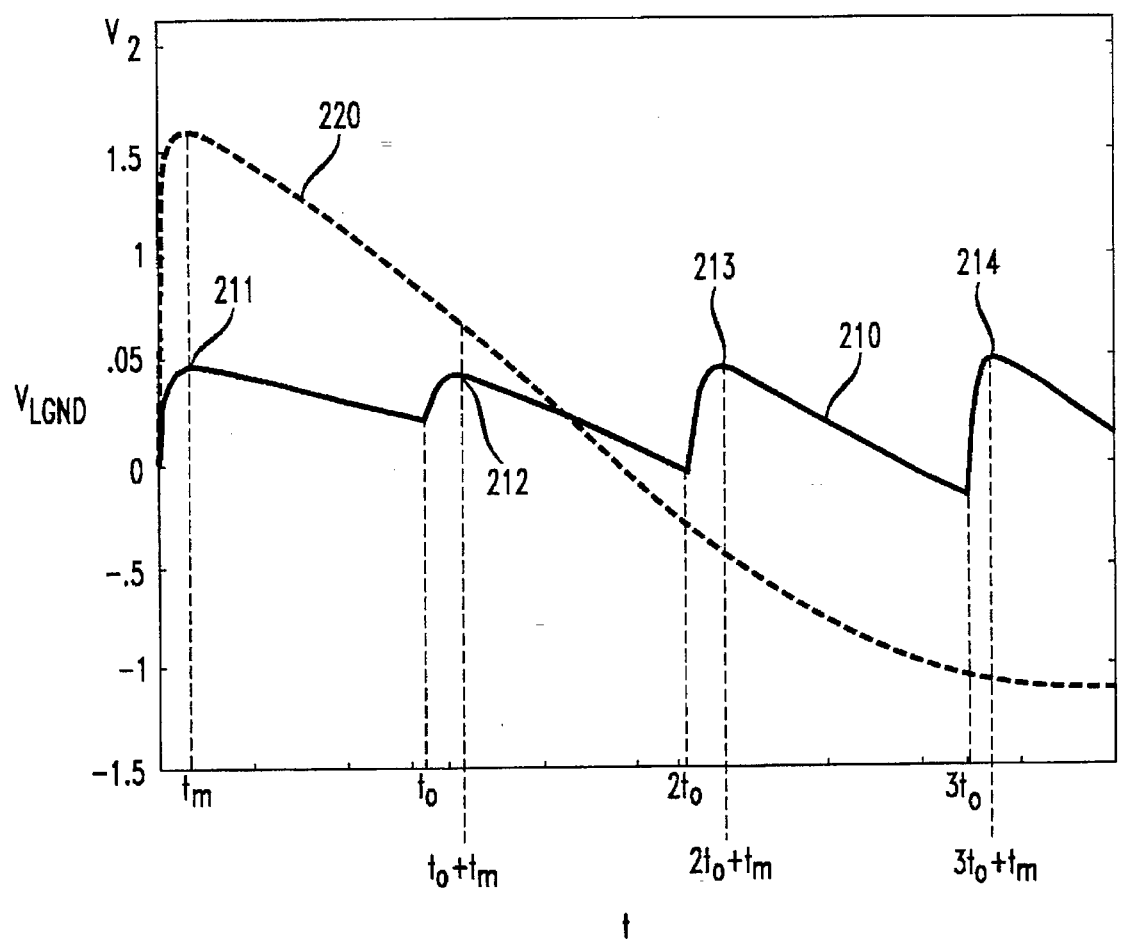
FIG. 3 illustrates a plot of an exemplary inductive noise voltage signals of the circuit of FIGS. 1 and 2.

An exemplary plot of the inductive noise voltage $V_{Lgnd}(t)$ as a function of time for a particular data signal grouping is illustrated in FIG. 3. In FIG. 3, an inductive noise voltage signal 210 is based on a communications line load capacitance of 25 pF, an effective ground inductance $L_{gnd}$ of 1 nH, a power supply of 5 V, a total number of drivers n of 32, a normalized total staggering value τ=2, wherein the total number of driver groups p is 4 with the number of drivers in each group being 7,4,9, and 12, respectively. The signal 210 is calculated based on each driver in each group switching logic states upon receipt of the respective control signal to illustrate the maximum inductive noise that can occur with such a circuit. Also, shown in FIG. 3 is an inductive noise voltage signal 220 when all the drivers 20 switch at once without any staggering of the data signals.

The inductive noise voltage signal 210 contains four local maxima 211, 212, 213 and 214 occurring at times $t_m$, $t_0+t_m$, $2t_0+t_m$, and $3t_0+t_m$, respectively. Each local maximum 211, 212, 213 and 214 occurs at a time interval $t_m$ after the control signal is received by respective groups at times 0, $t_0$, $2t_0$ and $3t_0$. Accordingly, each of local maxima 211, 212, 213 and 214 is a local maximum between times that respective driver groups receive their control signals which occurs at multiples times of time $t_0$ in FIG. 2. In FIG. 2, the delay circuits 130 provide the corresponding control signals to the respective groups at multiples of times of time $t_0$. For instance, the local maximum 213 occurs at the time $2t_0+t_m$, and corresponds to the simultaneous switching of the drivers in a third group that receives the control signal at time $2t_0$ after the control signal is provided to the first group. Accordingly, the local maximum 213 is the maximum amplitude of the inductive noise voltage signal 210 between the time $2t_0$ and the time $3t_0$ when a fourth driver group receives its control signal.

FIG. 3 illustrates that the use of such relatively short total staggering times causes a constructive combination in the inductive noise signal 210 generated by the respective groups of data signals because the signal 210 does not return to the starting position of 0 V between the occurrences of the controls signals at multiples of the time $t_0$. It should be readily understood that the longer the total staggering transmission time, the more time is required by the output section 5 to transmit the data signals. Accordingly, it is generally desirable to use the shortest possible total staggering transmission time to achieve a desired reduction in inductive noise.

It should be further understood that the use of different numbers of drivers in each group does not cause the general shape of a plot of the inductive noise voltage $V_{Lgnd}(t)$ to change with the respect to the time of the occurrences of the local maxima 211, 212, 213 and 214. However, the use of different numbers of drivers in each group causes the amplitude of the inductive noise voltage signal 210 at the respective local maxima 211, 212, 213 and 214 to change. Also, the use of different normalized total staggering values τ causes the relative distance between local maxima to change accordingly.

In determining the number of drivers to be included in each group, the goal is to minimize the overall amplitude of the inductive noise voltage $V_{Lgnd}(t)$ when all the drivers 20 in each group switch to minimize the corresponding ratio U and a reduction in the inductive noise. One suitable procedure for determining the number of drivers to be included in each group to minimize the inductive noise voltage $V_{Lgnd}(t)$ is as follows:

(1) Select a "best guess" number of drivers for the first group $B_0$ and determine the corresponding amplitude of the inductive noise voltage $V_{Lgnd}(t)$ at the first local maximum 211 at time $t_m$ in the manner described above with respect to calculating the inductive noise voltage $V_{Lgnd}(t)$;

(2) determine number of drivers in the second group $B_1$ by identifying the largest number of drivers that causes the amplitude of the local maximum 212 at time $t_0+t_m$ to be less than or equal to that of the local maximum 211 by calculating the inductive noise voltage $V_{Lgnd}(t)$ for the local maximum 212 for each attempted number of drivers for the second driver group;

(3) determine number of drivers in the third group $B_2$ by identifying the largest number of drivers that causes the amplitude of the local maximum 213 at time $2t_0+t_m$ to be less than or equal to that of the local maximum 212 in the manner described above with respect to step (2);

(4) determine number of drivers in the fourth group $B_3$ by identifying the largest number of drivers that causes the amplitude of the local maximum 214 at time $3t_0+t_m$ to be less than or equal to the local maximum 213 in the manner described above with respect to step (2), if such a relationship is not possible with the remaining number of drivers not used in the first though third groups in steps (2) and (3) then the number of drivers in the first group B0 must be increased in step (1) and steps (2) through (4) are repeated again; and (5) repeat steps (1) through (4) to achieve the smallest number of drivers in the first group $B_0$.

Table A provided below is based on the above procedure and contains the approximate number of drivers to be included in each of four driver groups for an integrated output section having 32 output drivers when the approximate normalized staggering value τ is in the range of 1.3 to 2 in 0.05 increments. This table also contains the corresponding ratio U for each grouping arrangement.

TABLE A

| τ | Number of Drivers in Each Group $\{B_0, B_1, B_2, B_3\}$ | Inductive Noise Upper limit Ratio U |
|---|---|---|
| 1.30 | 21, 2, 4, 5 | 0.736 |
| 1.35 | 19, 2, 5, 6 | 0.680 |
| 1.40 | 17, 3, 5, 7 | 0.623 |
| 1.45 | 16, 3, 6, 7 | 0.593 |
| 1.50 | 14, 3, 6, 9 | 0.531 |
| 1.55 | 13, 3, 7, 9 | 0.487 |
| 1.60 | 12, 4, 7, 9 | 0.466 |
| 1.65 | 11, 4, 7, 10 | 0.432 |
| 1.70 | 10, 4, 8, 10 | 0.398 |
| 1.75 | 9, 4, 8, 11 | 0.363 |
| 1.80 | 9, 4, 9, 10 | 0.363 |
| 1.85 | 8, 4, 8, 12 | 0.327 |
| 1.90 | 8, 4, 9, 11 | 0.327 |
| 1.95 | 8, 5, 10, 9 | 0.327 |
| 2.00 | 7, 4, 9, 12 | 0.289 |

Tables B, C and D provided below were also determined based on the above procedure and contain exemplary numbers of drivers to be included in each of two, four and eight driver groups, respectively, for transmitting 8, 16 and 32 and 64 data signals or bits with a normalized total staggered delay of approximately τ=2. The corresponding ratio U is provided for each of the listed groups in the tables B–D.

TABLE B

| | (Number of Driver Groups = 2) | |
|---|---|---|
| Total Number of Drivers | Drivers in Each Group $\{B_0, B_1\}$ | Inductive Noise Upper limit Ratio U |
| 8 | 3, 5 | 0.40 |
| 16 | 6, 10 | 0.424 |
| 32 | 11, 21 | 0.433 |
| 64 | 20, 44 | 0.475 |

TABLE C

| | (Number of Driver Groups = 4) | |
|---|---|---|
| Total Number of Drivers | Drivers in Each Group $\{B_0, B_1, B_2, B_3\}$ | Inductive Noise Upper limit Ratio U |
| 8 | 2, 1, 2, 3 | 0.270 |
| 16 | 4, 2, 5, 5 | 0.290 |
| 32 | 7, 4, 9, 12 | 0.289 |
| 64 | 14, 8, 18, 24 | 0.349 |

TABLE D

| | (Number of Driver Groups = 8) | |
|---|---|---|
| Total Number of Drivers | Drivers in Each Group $\{B_0–B_7\}$ | Inductive Noise Upper limit Ratio U |
| 8 | 1, 0, 1, 1, 1, 1, 1, 2 | 0.232 |
| 16 | 3, 0, 1, 2, 2, 2, 3, 3 | 0.221 |
| 32 | 6, 1, 2, 3, 4, 5, 6, 5 | 0.251 |
| 64 | 12, 2, 4, 6, 8, 10, 11, 11 | 0.306 |

The order of the values of the drivers in each group in Tables A–D should correspond to the order of the groupings of the drivers for timing controller purposes. The physical positioning of the drivers on the chip relative to one another is not critical in practicing the invention. Thus, the drivers in each group need not be located adjacent one another.

Further, in accordance with the invention, identical numbers of drivers can be used in each group to achieve reduction in inductive noise of 25% or greater with a normalized total staggering value of τ=6 or less. the substantially optimal number of groups to be used that contain an identical number of drivers can be determined in a similar procedure to that described above with respect to FIG. 3. In particular, the inductive noise voltage $V_{Lgnd}(t)$ can be calculated for different numbers of groups containing identical numbers of drivers to identify the number of groups that provides an enhanced reduction in inductive noise and which has a sufficiently short normalized total staggering value τ. Accordingly, the number of groups can be determined based on the desired reduction in inductive noise and the permitted longest total staggering time.

Tables E, F, G and H correspond to tables A, B, C and D, respectively, and illustrate the reduction in inductive noise achieved with varying the number of groups containing an identical number of drivers. Table E illustrates the reduction achieved in employing four groups having eight drivers each to transmit 32 data signals for selected normalized total staggering value τ between 1.4 and 2.0 in increments of 0.05 and between 2.0 and 6.0 in increments of 1.0. Tables F, G and H provided below contain exemplary numbers of drivers to be included in each of two, four and eight driver groups, respectively, for transmitting 8, 16 and 32 and 64 data signals or bits with a normalized total staggered value of τ=2.

TABLE E

| τ | Inductive Noise Upper limit Ratio U |
|---|---|
| 1.40 | 0.750 |
| 1.45 | 0.682 |
| 1.50 | 0.641 |
| 1.55 | 0.601 |
| 1.60 | 0.560 |
| 1.65 | 0.519 |
| 1.70 | 0.500 |
| 1.75 | 0.487 |
| 1.80 | 0.473 |
| 1.85 | 0.459 |
| 1.90 | 0.445 |
| 1.95 | 0.431 |
| 2.00 | 0.417 |
| 3.00 | 0.327 |
| 4.00 | 0.327 |
| 5.00 | 0.327 |
| 6.00 | 0.327 |

TABLE F (Number of Driver Groups = 2)

| Total Number of Drivers | Drivers in Each Group | Inductive Noise Upper limit Ratio U |
|---|---|---|
| 8 | 4 | 0.526 |
| 16 | 8 | 0.551 |
| 32 | 16 | 0.592 |
| 64 | 32 | 0.656 |

TABLE G (Number of Driver Groups = 4)

| Total Number of Drivers | Drivers in Each Group | Inductive Noise Upper limit Ratio U |
|---|---|---|
| 8 | 2 | 0.335 |
| 16 | 4 | 0.364 |
| 32 | 8 | 0.420 |
| 64 | 16 | 0.524 |

TABLE H (Number of Driver Groups = 8)

| Total Number of Drivers | Drivers in Each Group | Inductive Noise Upper limit Ratio U |
|---|---|---|
| 8 | 1 | 0.294 |
| 16 | 2 | 0.320 |
| 32 | 4 | 0.376 |
| 64 | 8 | 0.484 |

The staggering of the transmission of the output data signals by the driver groups enables the integrated circuit to provide information to the output section in a likewise staggered manner. Conventional integrated circuits provide such data to the output drivers simultaneously. Accordingly, if an integrated circuit requires additional time to generate particular information, then that particular information can be transmitted by drivers in a driver group having the substantially largest transmission delay relative to the first driver group. Further, the invention facilitates the use of less costly interconnect technologies, such as wire bonds and in line package leads, to be used to obtain a reduction in inductive noise normally associated with more complex and costly interconnects, such as ball grid arrays, flip-chips and directed chip attachment.

Although several embodiments of the invention have been described in detail above, many modifications can be made without departing from the teaching thereof. All of such modifications are intended to be encompassed within the following claims. For instance, although the invention has been described using wire bonds, it is possible to use other types of interconnects including, for example, ball grid arrays, flip-chips and directed chip attachment.

The invention claimed is:

1. An integrated circuit having at least one output section to transmit a plurality of data signals over a plurality of communication lines, the output section comprising:

a plurality of controllable drivers coupled to respective ones of the plurality of communication lines, the drivers further having data inputs for receipt of data to be transmitted and control inputs, wherein each driver is capable of transmitting a data signal on a respective communication line corresponding to data at its data input upon receipt of a control signal at its control input; and a controller coupled to the control inputs of the drivers, the controller providing control signals to the drivers to stagger the transmission of groups of data signals by the output drivers, wherein each group includes at least one data signal with at least one group including a different number of data signals than the other group or groups to achieve a reduction in inductive noise of greater than 25% relative to a corresponding non-staggered transmission of data signal, and wherein a substantially largest time interval in staggering the data signal of a last group relative to a first group is less than approximately five times the transition switching time of one of said drivers.

2. The device of claim 1 wherein the integrated circuit is a CMOS integrated circuit.

3. The integrated circuit of claim 1 wherein the substantially largest time interval is no greater than two times the driver transition switching time.

4. The device of claim 1 wherein each controllable driver includes a buffer connected to a line driver.

5. The device of claim 4 wherein the buffer is a flip-flop and wherein the driver control input is a clock input of the flip-flop.

6. The device of claim 1 wherein the controller comprises a plurality of delay circuits and wherein each delay circuit provides control signals to a respective group of output drivers except for a first driver group.

7. The device of claim 1 wherein the number of groups and drivers are 4 and 32, respectively, and the number of data signals in the four groups is seven, four, nine and twelve.

8. The device of claim 1 wherein data is provided to the data inputs of the drivers in at least one group a time interval later than data provided to the other output driver groups, and wherein the time interval is less than the time interval between the transmission of data signals of a last driver group relative to a first driver group.

9. An integrated circuit having at least one output section to transmit a plurality of data signals over a plurality of communication lines, the output section comprising:

a plurality of controllable drivers coupled to respective ones of the plurality of communication lines, the drivers further having data inputs for receipt of data to be transmitted and control inputs, wherein each driver is capable of transmitting a data signal on a respective communication line corresponding to data at its data input upon receipt of a control signal at its control input; and a controller coupled to the control inputs of the drivers, the controller providing control signals to the drivers to stagger the transmission of groups of data signals by the output drivers to produce a substantially constructive combination of inductive noise in said signals to achieve a reduction in inductive noise of greater than 25% relative to a corresponding non-staggered transmission of data signals, wherein a substantially largest time interval in staggering the data signal of a last group relative to a first group is less than approximately five times the transition switching time of one of said drivers.

10. The device of claim 9 wherein the integrated circuit is a CMOS integrated circuit.

11. The integrated circuit of claim 10 wherein at least one of the data signal groups has a different number of data signals than the other group or groups.

12. The integrated circuit of claim 11 wherein the substantially largest time interval is no greater than two times the driver transition switching time.

13. The integrated circuit of claim 10 wherein each group has an identical number of data signals and the number of groups is determined based on the permitted total staggering time and the desired reduction in inductive noise.

14. A method for transmitting a plurality of output data signals over a plurality of communication lines by an integrated circuit output section comprising:

provided a plurality of input data signals to inputs of a like plurality of controllable drivers; and staggering the transmission of groups of output data signals on respective communication lines by the controllable drivers wherein each group includes at least one data signal to produce a substantially constructive combination of inductive noise in said signals to achieve a reduction in inductive noise of greater than 25% relative to a corresponding nonstaggered transmission of data signals, wherein a last group of output data signals are transmitted at a time interval after a first output data signal group that is less than approximately five times the transition switching time of one of said drivers.

15. The method of claim 14 wherein the input data signals are provided to the data inputs of the drivers of at least one group a time interval later than the input data signals are provided to the other driver groups, and wherein the time interval is less than the time difference between transmission of the data signals by a last driver group relative to a first driver group.

16. The method of claim 15 wherein at least one group includes a different number of drivers than the other group or groups.

17. The method of claim 16 wherein the time interval is no greater than the driver transition switching time.

18. The method of claim 15 wherein each group has an identical number of data signals and the number of groups is determined based on the permitted total staggering time and the desired reduction in inductive noise.

* * * * *